(12) United States Patent
Denham

(10) Patent No.: US 6,417,720 B1
(45) Date of Patent: Jul. 9, 2002

(54) HIGH VOLTAGE SENSE CIRCUIT FOR PROGRAMMING OF PROGRAMMABLE DEVICES

(75) Inventor: Martin S. Denham, Yamhill, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/751,444

(22) Filed: Dec. 28, 2000

(51) Int. Cl.[7] .......................... H01H 37/76; H01H 85/00
(52) U.S. Cl. ........................................... 327/525; 327/53
(58) Field of Search ................................ 327/525, 51–57; 365/225.7

(56) References Cited

U.S. PATENT DOCUMENTS

| | | | | |
|---|---|---|---|---|
| 4,730,129 A | * | 3/1988 | Kunitoki et al. | 327/525 |
| 5,731,733 A | * | 3/1998 | Denham | 327/525 |
| 5,959,445 A | * | 9/1999 | Denham | 323/315 |
| 6,208,549 B1 | * | 3/2001 | Rao et al. | 365/96 |

* cited by examiner

*Primary Examiner*—Terry D. Cunningham
*Assistant Examiner*—Quan Tra
(74) *Attorney, Agent, or Firm*—Blakely, Sokoloff, Taylor & Zafman LLP

(57) ABSTRACT

A sense circuit for programming a fuse device and sensing the fuse device's state is disclosed. The sense circuit utilizes sense transistors that are formed by high voltage VDNMOS transistors. This allows a higher programming voltage to be used in the programming of the fuse device.

14 Claims, 1 Drawing Sheet

HIGH VOLTAGE SENSE CIRCUIT FOR PROGRAMMING OF PROGRAMMABLE DEVICES

TECHNICAL FIELD OF THE INVENTION

The present invention relates to a sensing and programming circuit for programming a fuse cell, and more particularly, to a sense circuit that can operate with high programming voltage.

BACKGROUND OF THE INVENTION

In CMOS integrated circuits, it is often desirable to be able to permanently store information, or to form permanent connections on the integrated circuit after it is manufactured. Fuses or other devices forming fusible links are frequently used for this purpose. Fuses can be used to program redundant elements to replace identical defective elements, for example.

Fuse devices are selectively programmed to provide the capabilities described above. Where one or more fuses is used for information storage purposes, a sensing circuit it typically used to determine whether the associated fuse has been programmed or not, i.e., a sensing circuit is used to determine the value "stored". Sensing circuits operate to distinguish between programmed and unprogrammed (or burned and unburned) fuses, usually by detecting a change in the resistance of the fuse device from a low to a high value.

An issue arises because of the smaller geometries provided by modem process technologies. Smaller geometries include smaller line widths and device sizes. At reduced geometries, the resistance of the fuse device is more difficult to control. In some cases, the difference in a resistance between a burned fuse and an unburned fuse maybe so small that the difference is difficult to detect with prior fuse sensing circuits.

Furthermore, as processes move to lower supply voltages, the voltage available to program fuses is decreased. As the fuse programming voltage is lowered, the number of "marginally burned" fuses increases. Fuses are considered to be marginally burned when, after programming, the resistance of the fuse remains low enough that there is an unacceptable risk that the fuse might be identified as being unprogrammed when its state is sensed. Therefore, marginally burned fuses may compromise the functionality of quality of circuit that uses the fuse. This is particularly true where the state of the single fuse determines that state of a fuse based storage cell. Additional or redundant fuses have previously been provided for this type of cell, but each redundant fuse takes up valuable space.

Thus, it is preferred to have fuses that can be programmed using a higher voltage supply. The use of a higher voltage supply insures that the number of marginally burned fuses is minimal. However, in order to use high voltages to program the fuse cells, a high voltage sensing circuit must be developed.

DETAILED DESCRIPTION

Figure 1:
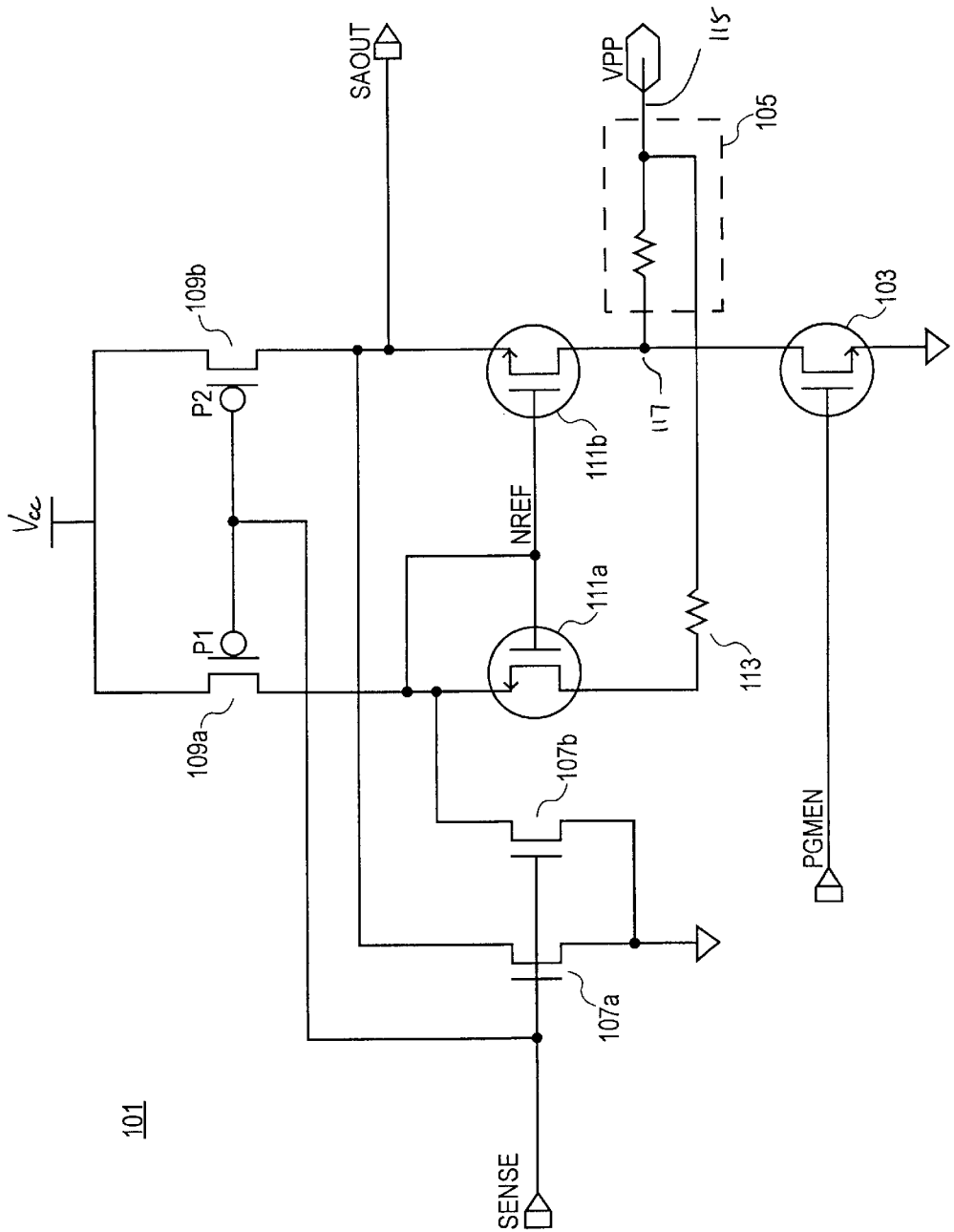
FIG. 1 is a schematic diagram of a programming and sensing circuit formed in accordance with the present invention.

A sense circuit 101 formed in accordance with the present invention is shown in FIG. 1. The sense circuit 101 includes a high voltage VDNMOS transistor 103, a fuse device 105, clamping transistors 107a and 107b, load transistors 109a and 109b, sense transistors 111a and 111b, and reference resistor 113.

A sense signal (designated SENSE in FIG. 1) is applied to the gates of the clamping transistors 107a and 107b. The sense signal is also applied to the load transistors 109a and 109b. Because the load transistors 109a and 109b are PMOS transistors, a low voltage level for the sense signal will cause these transistors to turn on. The clamp transistors 107a and 107b will turn on if the sense signal has a high voltage level.

The terms low voltage level (or simply "low") and high voltage level (or "high") refer to logic levels and not absolute voltages. Thus, for an integrated circuit that operates on a 3.3 volt supply, the low voltage level would be nominally 0 volts and the high voltage level would be nominally 3.3 volts. Devices with different supply voltages would have different absolute voltages for the high voltage level.

The sense signal controls the operation of the sensing circuit 101. Specifically, when the sense signal is low, the sensing circuit 101 senses the state of the fuse device 105. When the sense signal is high, this will cause the sense circuit 101 to program the fuse device 105. It can be appreciated by those of ordinary skill in the art that the programming of the fuse device 105 can generally only occur once.

The VDNMOS 103 is a high-voltage device, which prevents sensitive downstream devices from being exposed to high-voltage inputs. A VDNMOS is a special type of nMOS transistor also known as a high voltage compatible CMOS transistor. These types of transistors are well known in the art. The drain of the VDNMOS can be safely connected to a relatively high voltage. In this case, a high voltage is any voltage that is substantially higher than $V_{cc}$. However, the source of the VDNMOS cannot be exposed to a high voltage and the source can only be safely connected to a signal only up to $V_{cc}$. Although in the preferred embodiment, a VDNMOS is used for device 103, any type of device that has the equivalent functionality may be utilized.

Besides the sense signal, two other inputs are provided to the sense circuit 101. Specifically, an programming enable input signal (PGMEN) is coupled to the gate of high voltage VDNMOS transistor 103. Additionally, a first terminal 115 of the fuse device 105 is coupled to a programming voltage signal ($V_{pp}$). The fuse device 105 also includes a second terminal 117 that is connected to the drain of the VDNMOS 103.

If a programming event is desired, as noted above, the sense signal is biased to high ($V_{cc}$). Additionally, the input signal PGMEN is biased to high ($V_{cc}$). Finally, the terminal $V_{pp}$, which is attached to one terminal of the fuse device 105, is biased to a high programming voltage, typically significantly higher than the supply voltage $V_{cc}$.

By biasing the input signal PGMEN to high, this causes the VDNMOS 103 to turn on. The drain of the VDNMOS 103 then is pulled to ground, causing a high voltage differential across the fuse device 105. This causes a fuse burn event to occur at fuse device 105. Following completion of the bum event of the fuse device 105, the input signal PGMEN is taken back to low ($V_{ss}$).

The sense signal when high causes the clamping transistors 107a and 107b to turn on, while causing the load transistors 109a and 109b to turn off. The effect of this is that the node NREF is held to SAOUT, i.e., ground, causing the sense transistors 111a and 111b to be off, thereby allowing the fuse burn event to proceed. During the programming event, clamping transistors 107a and 107b protect the other devices of the sensing circuit 101, notably load transistors 109a and 109b, from dangerously high voltages. Finally, when the sense signal is high and the PGMEN signal is low, the sense circuit 101 draws no static current (other than possible leakage current).

When not in a programming state, the sense circuit 101 is used to sense or determine the state of the fuse device 105. During sensing, the signal $V_{pp}$ is connected to ground ($V_{ss}$). Signal $V_{pp}$ remains at ground during all sensing operations. Further, the sense signal is at low, causing load transistor 109a and 109b to be turned on. Clamp transistors 107a and 107b are turned off and do not play a role in sensing.

With the load transistors 109a and 109b turned on, this causes normal sense amplification operation by the sense transistors 111a and 111b. Specifically, the load transistors 109a and 109b allow the high voltage level ($V_{cc}$) to be connected to the sources of the sense transistors 111a and 111b. Additionally, the high voltage level ($V_{cc}$) also turns on the sense transistors 111a and 111b. This allows current to flow through the sense transistors 111a and 111b through the reference resistor 113 and fuse device 105, respectively.

The sense transistors 111a and 111b are also high voltage VDNMOS devices. As seen in FIG. 1, the drain of sense transistor 111b is connected to second terminal 117. The source of sense transistor 111b is connected to a node that provides the sense amplifier output signal (SAOUT). Finally, the gate of the sense transistor 111b is connected to node NREF. Similarly, the drain of sense transistor 111a is connected through reference resistor 113 to first terminal 115. The source and gate of sense transistor 111a is connected to NREF.

During sensing, the resistance of the fuse device 105 is compared to the reference resistor 113. The resistance of the fuse device 105 is measured by sense transistor 111b, while the resistance of the reference resistor 113 is measured by sense transistor 111a. If the resistance of the fuse device 105 is of larger value than the reference resistor 113 (when, for example, an open circuit is presented in a burned fuse device), then the output signal SAOUT goes to a high potential. If the fuse device 105 has a resistance that is lower than the reference resistor 113, i.e., the resistor in the fuse device 105 is unburned, then more current flows through the fuse device 105, causing the output signal SAOUT to go to a low potential.

Note importantly that the sensing transistors 111a and 111b are inverted. In other words, the drains of sense transistors 111a and 111b face the fuse device 105 and the reference resistor 113. Furthermore, the sources of the sense transistors 111a and 111b face the load transistors 109a and 109b. The drains of the sense transistors 111a and 111b are connected to the reference resistor 113 and the fuse device 105. The use of VDNMOS devices for the sense transistors 111a and 111b is advantageous because this allows a relatively high voltage $V_{pp}$ to be applied during programming of the fuse device 105.

It should be noted that the sense transistors 111a and 111b should be carefully sized so that their effective gain, source and drain resistance, and threshold voltage mismatch are better than or equal to conventional sense transistors.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A programmable fuse and sense circuit comprising:
   a fuse device having a first terminal and a second terminal, said first terminal connected to a programming voltage signal;
   a programming VDNMOS transistor having its gate connected to a programming enable signal and its drain connected to said second terminal of said fuse device;
   a first sense VDNMOS transistor having its drain connected to said first terminal through a reference resistor, and its source and gate connected to a supply voltage; and
   a second sense VDNMOS transistor having its drain connected to said second terminal, and its source connected to a sense amplifier output signal node and its gate connected to said supply voltage.

2. The circuit of claim 1 further comprising:
   a first clamp transistor having its drain connected to the source of said first sense VDNMOS transistor and its gate connected to a sense signal; and
   a second clamp transistor having its drain connected to the source of said second sense VDNMOS transistor and its gate connected to said sense signal.

3. The circuit of claim 2 wherein said first and second clamp transistors have their sources connected to ground.

4. The circuit of claims 3 further comprising:
   a first load transistor connected between the source of said first sense VDNMOS transistor and said supply voltage; and
   a second load transistor connected between the source of said second sense VDNMOS transistor and said supply voltage.

5. The circuit of claim 4 wherein said first and second load transistors are pMOS transistors.

6. The circuit of claim 1 further comprising:
   a first load transistor connected between the source of said first sense VDNMOS transistor and said supply voltage; and
   a second load transistor connected between the source of said second sense VDNMOS transistor and said supply voltage.

7. The circuit of claim 6 wherein said first and second load transistors are pMOS transistors.

8. A method of programming and sensing a fuse device comprising:
   providing a fuse device with a first terminal and a second terminal and connecting said first terminal to a programming voltage signal;
   providing a programming VDNMOS transistor and connecting its gate to a programming enable signal and connecting its drain to said second terminal of said fuse device;
   providing a first sense VDNMOS transistor and connecting its drain to said first terminal through a reference resistor, and connecting its source and gate to a supply voltage; and providing a second sense VDNMOS transistor and connecting having its drain to said second terminal, connecting its source to a sense amplifier output signal node, and connecting its gate to said supply voltage.

9. The method of claim 8 further comprising:

providing a first clamp transistor and connecting its drain to the source of said first sense VDNMOS transistor and connecting its gate to a sense signal; and providing a second clamp transistor and connecting its drain to the source of said second sense VDNMOS transistor and connecting its gate to said sense signal.

10. The method of claim 9 further connecting the sources of said first and second clamp transistors to ground.

11. The method of claim 10 further comprising:

connecting a first load transistor between the source of said first sense VDNMOS transistor and said supply voltage; and connecting a second load transistor between the source of said second sense VDNMOS transistor and said supply voltage.

12. The method of claim 11 wherein said first and second load transistors are pMOS transistors.

13. The method of claim 8 further comprising:

connecting a first load transistor between the source of said first sense VDNMOS transistor and said supply voltage; and connecting a second load transistor between the source of said second sense VDNMOS transistor and said supply voltage.

14. The method of claim 13 wherein said first and second load transistors are pMOS transistors.

* * * * *

UNITED STATES PATENT AND TRADEMARK OFFICE
CERTIFICATE OF CORRECTION

PATENT NO. : 6,417,720 B1
DATED : July 9, 2002
INVENTOR(S) : Denham

It is certified that error appears in the above-identified patent and that said Letters Patent is hereby corrected as shown below:

<u>Column 1,</u>
Line 31, delete "modem", insert -- modern --.

<u>Column 2,</u>
Line 62, delete "bum", insert -- burn --.

Signed and Sealed this

Twenty-fifth Day of February, 2003

JAMES E. ROGAN
*Director of the United States Patent and Trademark Office*